United States Patent [19]
Cain et al.

[11] 4,143,342
[45] Mar. 6, 1979

[54] MICRO-CIRCUIT ARRANGEMENTS

[75] Inventors: William D. Cain; Denis G. Hall, both of St. Albans; John D. Middleton, Welwyn, all of England

[73] Assignee: Marconi Instruments Limited, Chelmsford, England

[21] Appl. No.: 849,349

[22] Filed: Nov. 7, 1977

[30] Foreign Application Priority Data

Nov. 13, 1976 [GB] United Kingdom ............... 47352/76

[51] Int. Cl.² ............................................. H01P 5/00
[52] U.S. Cl. ..................................... 333/33; 333/246
[58] Field of Search .................. 333/33, 84 M; 339/19, 339/17 LC, 17 M, 17 LM

[56] References Cited
U.S. PATENT DOCUMENTS

| | | | |
|---|---|---|---|
| 2,946,024 | 7/1960 | Mills | 333/84 M |
| 3,201,722 | 8/1965 | May et al. | 333/84 M |
| 3,270,311 | 8/1966 | Deer et al. | 339/17 M |
| 3,496,492 | 2/1970 | Kurzl et al. | 333/84 M |

*Primary Examiner*—Neil Abrams
*Attorney, Agent, or Firm*—Diller, Ramik & Wight

[57] ABSTRACT

The invention concerns micro-circuit arrangements in which two micro-circuits each consisting of an assembly of components and/or micro-strip conductors within individual compartments, are interconnected. In the arrangement provided by the invention the individual compartments have a common wall in which a gap is provided adjacent the ends of a micro-strip conductor in each micro-circuit and a bridge piece is provided to fit into the gap, which bridge piece consists of a block of dielectric material carrying a conductive member which connects with both micro-strip conductors adjacent the gap.

10 Claims, 6 Drawing Figures

U.S. Patent Mar. 6, 1979 Sheet 1 of 2 4,143,342

U.S. Patent   Mar. 6, 1979   Sheet 2 of 2   4,143,342

MICRO-CIRCUIT ARRANGEMENTS

This invention relates to micro-circuit arrangements in which two (or more) micro-circuits, each consisting of an assembly of components and/or microstrip conductors within individual compartments, are interconnected. The term "micro-circuit" is used broadly to cover any high frequency circuit terminating in a stripline.

Figure 1:
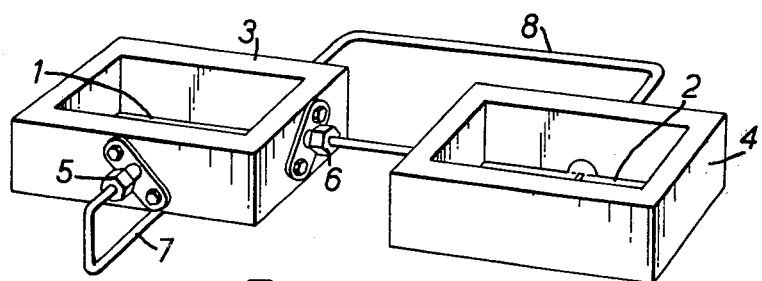

Hitherto it has been common to interconnect two micro-circuits by means of co-axial connectors and rigid co-axial cable. A typically known micro-circuit arrangement of this kind is illustrated in FIG. 1 of the accompanying drawings wherein two micro-circuits 1 and 2 are provided in two compartments 3 and 4. The micro-circuits 1 and 2 are interconnected as required by means of bulkhead connectors such as 5 and 6 and rigid co-axial cables 7 and 8. This method of connection involves a soldered connection between a microstrip conductor forming part of the micro-circuit and the bulkhead connector.

Not only is such an arrangement cumbersome and relatively expensive, but, also it requires that the bulkhead connectors such as 5 and 6 be unsoldered before an individual micro-circuit can be individually tested or removed.

The present invention seeks to provide an improved micro-circuit arrangement in which the above difficulty is avoided.

According to this invention a micro-circuit arrangement comprises two micro-circuits each within adjacent individual compartments having a common wall, and wherein a gap is provided in said common wall adjacent the ends of a microstrip conductor in each micro-circuit which are to be connected one to the other and a bridge piece is provided to fit into said gap, said bridge piece consisting of a block of dielectric material carrying a member of conductive material of which, when said bridge piece is fitted into said gap, one end electrically connects with one of said microstrip conductors and the other end with the other of said microstrip conductors.

Preferably said conductive member is a blade, one edge of which is provided to contact said two microstrip conductors, said blade having a thickness which is less than the width of a microstrip conductor and a width (that is to say a dimension in a plane perpendicular to the plane of the microstrip conductors) chosen in dependence upon the characteristic impedance of said microstrip conductors for optimum matching.

Preferably said block is such that its end adjacent the base of said gap is substantially flush with said one edge of said blade.

Preferably a spring blade extending from said common wall is provided to urge said bridge piece into said gap.

In one embodiment of the invention where said characteristic impedance is 50 ohms, said blade has a width equal to 0.115".

A connector may be provided in accordance with the present invention, which consists of a block of dielectric material provided to fit into said gap, and a connecting strip of conductive material of which, when said block is fitted into said gap, one end only connects with one of said microstrip conductors, the other end of said conductive member being connected to the inner conductor of a co-axial socket, whereby electrical signals may be injected into or removed from one of said microstrip conductors in isolation from the other.

Preferably in each case said dielectric material of said block is PTFE and the conductive material of said blade or connecting strip is gold plate brass.

FIG. 1 shows a known micro-circuit arrangement.

Figure 2:
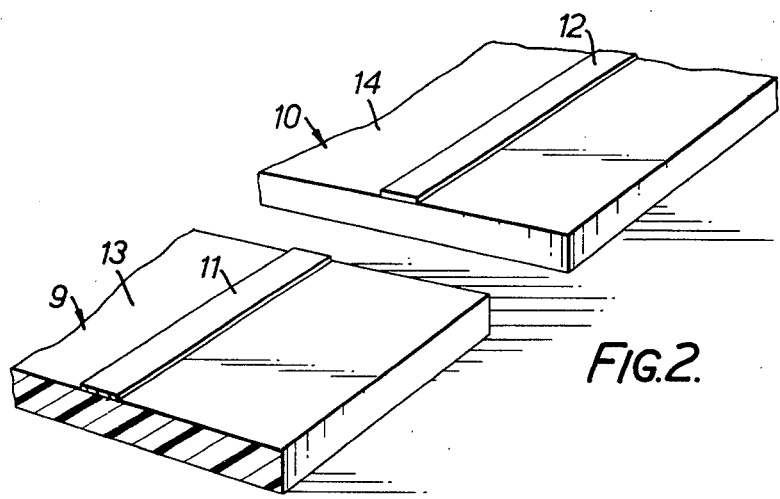
Figure 3:
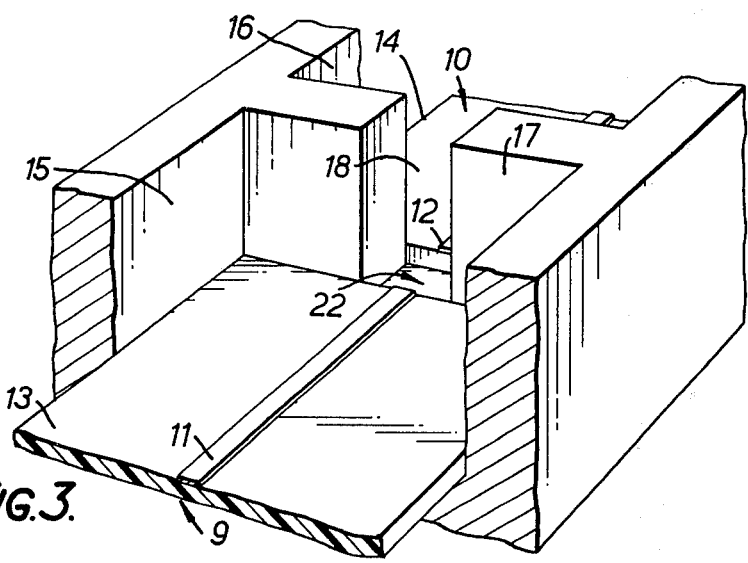
Figure 4:
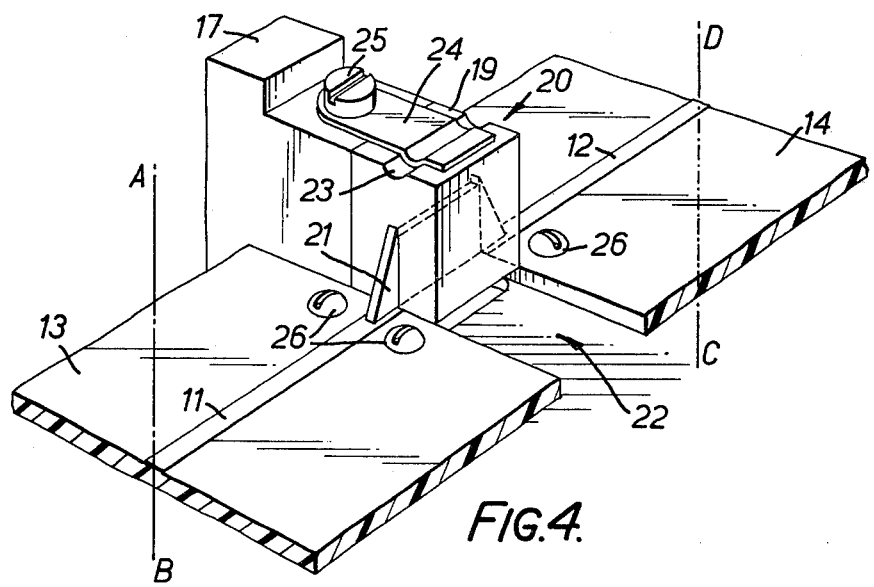
Figure 5:
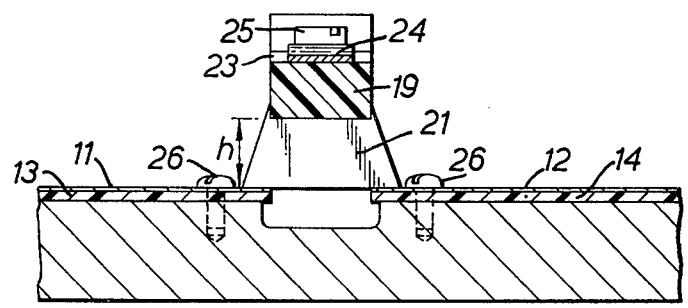
Figure 6:
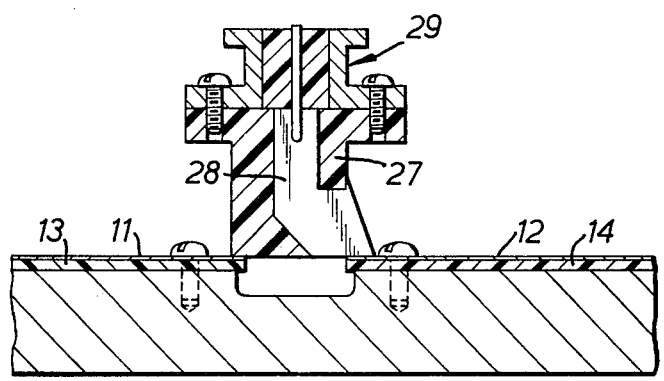

The invention is further described with reference to FIGS. 2 to 6 of the accompanying drawings in which, FIG. 2 illustrates the requirement for coupling the microstrip conductors of two micro-circuits together, FIG. 3 is a perspective view of two micro-circuits separated by a common wall of a pair of compartments in accordance with the present invention, FIG. 4 is a part cut away perspective view of the arrangement of FIG. 3 showing a bridging piece in position, FIG. 5 is a cross-section of the arrangement of FIG. 4 in the plane ABCD and FIG. 6 is a cross-section similar to that of FIG. 5, but illustrating an isolating connector in accordance with the present invention.

Referring to FIG. 2, two micro-circuits which are to be interconnected are represented at 9 and 10. The point of interconnection in each case is a microstrip conductor 11 or 12 provided upon a substrate of dielectric material 13 or 14 which forms the substrate for the whole of the micro-circuit 9 or 10 respectively.

Referring to FIG. 3, the micro-circuits 9 and 10 of FIG. 2 are shown positioned within their respective individual compartments 15 and 16. Unlike the arrangement of FIG. 1, in this case the compartments 15 and 16 are immediately adjacent and share one common boundary wall 17. The boundary wall 17 includes a gap 18 adjacent the two ends of the microstrip conductors 11 and 12, which are to be interconnected.

As best seen from FIG. 4, connection between the two microstrip conductors 11 and 12 is achieved by means of a bridge piece 19 which is a "close" fit between the walls of the gap 18. The bridge piece consists of a block 20 of PTFE into which is let a blade 21 of gold plated brass which forms a connecting strip between the microstrip conductors 11 and 12 when the bridge piece 19 is inserted into the gap 18. The end of the block 20 adjacent the base of the gap 18 is flush with the bottom edge of the blade 21. With the bridge piece 19 in position in the gap 18, the bottom edge of the blade 21 rests to one side on the microstrip conductor 11 and to the other on the microstrip conductor 12.

The bridge piece 19 is formed with a channel 23, in which rests the shaped end of a pressure spring blade 24, which is secured to the top of the common wall 17 by means of a screw 25. As shown the top of the common wall 17 is recessed, where the end of the pressure spring 24 fits in order that this and its securing screw 25 will not obstruct the fitting of a lid (not shown) over the different compartments such as 15 and 16.

In order to ensure a good connection of the earth plane formed by the dielectric substrate 13 or 14 to the base 22 of the compartments 15 and 16 in the region of interconnection, nylon screws 26 are used securing the substrate 13 or 14 to the base 22.

The blade 21 has a thickness which is less than the width of each microstrip conductor 11 and 12. The thickness of the blade 21 is not particularly critical. The width (or height as viewed) h of the blade, however, is chosen in dependence upon the characterstic impedance of the microstrip conductor 11 or 12, in order to provide optimum matching. For a blade as described in a block 20 of PTFE, the width or height h of the blade 21 (see FIG. 5) is 0.115" where, as is typically the case, each microstrip conductor 11 and 12 has a characteristic impedance of 50 ohms.

As will be appreciated with an arrangement in accordance with the present invention all that is required to isolate the two micro-circuits 9 and 10 is to remove the bridge piece 19. Furthermore, each micro-circuit 9 or 10 may be tested individually by providing a connector as shown in FIG. 6 which consists of a body 27 of PTFE material, shaped at its lower end in accordance with the shape of the lower end of the bridge piece 19 already described. In place of the blade 21, however, is a connecting strip 28 of gold plated brass which extends within the PTFE body 27 to make contact with one only of the microstrip conductors 11 or 12. At the opposite end of the connecting strip 28, connections made to a co-axial socket 29 by means of which signals may be injected into or taken off a micro-circuit.

We claim:

1. A micro-circuit arrangement comprising two micro-circuits each within adjacent individual compartments having a common wall, and wherein a gap is provided in said common wall adjacent the ends of a microstrip conductor in each micro-circuit which are to be connected one to the other and a bridge piece is provided to fit into said gap, said bridge piece consisting of a block of dielectric material carrying a member of conductive material of which, when said bridge piece is fitted into said gap, one end of said conductive member electrically connects with one of said micro-strip conductors and the other end of said conductive member connects with the other of said microstrip conductors.

2. An arrangement as claimed in claim 1 and wherein said conductive member is a blade, one edge of which is provided to contact said two microstrip conductors, said blade having a thickness which is less than the width of a microstrip conductor and a width chosen in dependence upon the characteristic impedance of said microstrip conductors for optimum matching.

3. An arrangement as claimed in claim 1 and wherein said block is such that its end adjacent the base of said gap is substantially flush with said one edge of said blade.

4. An arrangement as claimed in claim 1 and wherein a spring blade extending from said common wall is provided to urge said bridge piece into said gap.

5. An arrangement as claimed in claim 2 and wherein said characteristic impedance is 50 ohms and said blade has a width equal to 0.115".

6. An arrangement as claimed in claim 1 and wherein said dielectric material of said block is PTFE and the conductive material of said blade is gold plated brass.

7. A micro-circuit arrangement comprising two micro-circuits each within adjacent individual compartments having a common wall, and wherein a gap is provided in said common wall adjacent the ends of a microstrip conductor in each micro-circuit which are to be connected one to the other and a bridge piece consisting of a block of dielectric material carrying a member of conductive material of which, when said bridge piece is fitted into said gap, one end of said conductive member electrically connects with one of said microstrip conductors, a socket having a conductor, and the other end of said conductive member being connected to said conductor whereby electrical signals may be injected in or removed from said one microstrip conductor in isolation from said other microstrip conductor.

8. An arrangement as claimed in claim 7 wherein said conductor is in inner co-axial relationship to said socket.

9. An arrangement as claimed in claim 7 wherein said dielectric material of said block is PTFE and the conductive material of said blade is gold plated brass.

10. An arrangement as claimed in claim 1 wherein said common wall is disposed generally normal to said microcircuits, said common wall has a terminal end surface, and said gap opens into each of said compartments and through said terminal end surface.

* * * * *